United States Patent [19]

Minor

[11] 4,363,976
[45] Dec. 14, 1982

[54] SUBINTERVAL SAMPLER

[75] Inventor: Timothy R. Minor, Plano, Tex.

[73] Assignee: Rockwell International Corporation, El Segundo, Calif.

[21] Appl. No.: 226,321

[22] Filed: Jan. 19, 1981

[51] Int. Cl.³ .............................................. G11C 27/02
[52] U.S. Cl. .................................... 307/353; 307/351; 328/151
[58] Field of Search ............... 307/242, 243, 351, 352, 307/353; 328/104, 151, 154

[56] References Cited

U.S. PATENT DOCUMENTS 3,835,400  9/1974  Briscoe ................................. 307/351
4,066,919  1/1978  Huntington .......................... 307/353

Primary Examiner—John Zazworsky

Attorney, Agent, or Firm—Michael E. Taken; V. Lawrence Sewell; Howard R. Greenberg

[57] ABSTRACT

A subinterval sampler is provided for sampling short duration analog input signal pulses with slower speed processing hardware than would otherwise be required. The peak value of the input signal is detected during each sampling interval regardless of the absolute times at which peaks occur, an no input signal peak is missed. A pair of parallel peak detectors have active intervals overlapped by a duration longer than the rise time of the peak detectors, and have nonconcurrent inactive intervals for clearing. The outputs of the peak detectors are alternately switched into sample and hold circuitry at a switching rate equal to the sampling rate but staggered such that switching times occur midway in the sampling intervals.

27 Claims, 11 Drawing Figures

4,363,976

SUBINTERVAL SAMPLER

The Government has rights in this invention pursuant to Contract No. MDA903-79-C-0088 awarded by the Defense Advanced Research Projects Agency (ARPA).

TECHNICAL FIELD

The invention relates to a sampling circuit which selects the peak value of an analog input signal pulse voltage spike during each sampling interval, regardless of the absolute times at which the peaks occur. In one specific application in a direct sequence spread spectrum (DSSS) radio system wherein receiver data detection is accomplished with a correlator which functions as a matched filter, the invention particularly relates to post-correlator signal processing.

BACKGROUND

The present invention evolved from efforts to provide improved sampling circuitry for post-correlator signal processing in a direct sequence spread spectrum (DSSS) radio system, though the invention is of course not limited thereto.

In a DSSS radio system, a data bit is spread out into a plurality of chips, and is transmitted as a burst of many chips which modulate an RF carrier. For example, a data bit in a signal stream having a rate of 100 kilobits per second may be transmitted as a group of 1,000 chips or mini-bits in a signal stream having a rate of 100 megabits per second. The receiver has a correlator which functions as a matched filter to output very short duration analog voltage spikes (correlation peaks) when the group of chips matches a given chip code to thus indicate that a data bit 1 or a data bit 0 has been received. A classical result of matched filter theory is that the signal-to-noise ratio (SNR) is maximized at one instant in time. The SNR is at a maximum at the time that a correlation peak occurs.

The receiver correlator may be implemented before or after demodulation but is most easily understood in its baseband (after demodulation) form. The baseband correlator usually includes a comparator delay line and a summing amplifier. The comparator delay line receives the group of chips serially therethrough, one chip at a time. In the above example, this comparator delay line would have 1,000 serial chip locations, and the group of 1,000 chips would be serially shifted through the comparator delay line at the 100 megabit per second rate. Each location has a tap for comparing whether the chip currently in that location matches a predetermined chip code value for that location. Each of the location taps is connected in parallel to a summing amplifier.

The output of the summing amplifier is maximum when each of the 1,000 taps thereinto are high, which indicates that each of the 1,000 chips in the comparator delay line matches the predetermined chip code value for each of the 1,000 locations. The summing amplifier then outputs a correlation peak or voltage spike to indicate a digital 1 data bit, i.e., the 1,000 chips at the 100 megabit per second rate represents a single data bit having a value 1 at the 100 kilobit per second data rate. Another summing amplifier and a different chip code is provided for indicating a data bit value of 0. Transmission channel effects such as waveform distortion, noise, and interference will act to reduce the ideal amplitude of the correlation peak.

Since the group of 1,000 chips is shifted through the comparator delay line at a 100 megabit per second rate, a correlation peak has a very short duration, namely about 10 nanoseconds. This correlation peak duration of course depends on the amount of spreading of the original data bit, which is in turn constrained by the speed of the correlator hardware, particularly the comparator delay line and the summing amplifier. For example, if a 100 kilobit per second data stream bit is spread to only 4 chips, then the comparator delay line need only be 4 chips long, with the 4 chips being shifted therethrough at a rate of 400 kilobits per second. In this example, the output pulses of the summing amplifier may have a duration of 2.5 microseconds.

The higher the initial data rate, or the greater the amount of spreading, the shorter the duration of the output voltage spikes from the summing amplifier in the receiver correlator. These correlator output pulses are of varying height, depending on the percentage of chip location matches in the comparator delay line. Peaks occur at variable times and this, coupled with their short duration, presents difficulties in detection. Extremely fast signal processing hardware is usually needed following the receiver correlator in order to extract information from the short duration correlation peaks. The present invention involves this post-correlator signal processing, and enables the use of much slower signal processing hardware than would otherwise be required.

Recent innovations in surface acoustic wave devices allow correlators to be easily implemented at an intermediate frequency (IF) before demodulation. Consequently, this is a very common implementation. In this case the correlation peak shape is generally not rectangular, but rather is approximately triangular in shape.

A standard post-correlator sampler composed of a sample and hold circuit performs a sampling operation on the correlator output at given sampling times. If a correlation peak occurs at sometime other than a sampling time, then there is no signal generated at the sampler output for that spike, and hence that spike is missed. In order to avoid missing any correlation peak spikes, the sampling interval must be made very small, i.e., many closely spaced samples must be taken. For a baseband correlator (or a rectangular correlation peak), the sampling times can be spaced by no more than the duration of the correlation peak. For other correlators (not baseband) the correlation peak is a changing analog value during its duration, and the height of the peak represents vital information. As above noted, this latter non-baseband correlator (before demodulation) is a very common type.

In order to extract information regarding the height of the peak, the sampling interval for the standard post-correlator sampler must be further reduced such that a plurality of sampling times occur within the duration of a single correlation peak. For example, to take four samples during a 10 nanosecond correlation peak duration would require a sampling interval of only 2.5 nanoseconds between sampling times.

A one-shot generator is a commonly known digital logic element which produces an adjustable width output pulse when triggered by a short duration input pulse. The one-shot operates as a pulse stretcher, since short input pulses produce longer output pulses. The one-shot could then be followed by lower speed digital logic for further signal processing requirements. This approach is objectionable because the one-shot lacks a transfer of analog information pertaining to the amplitude of the peaks from the correlator. The one-shot is a strictly digital device with a fixed trigger level threshold. Because of the loss of analog information, finer time resolution in the post-correlator signal processing is required to obtain equivalent performance to a system which retains this analog information.

The digital approach could be modified to allow analog information from the correlator to be retained by using several one-shots, each with a different trigger threshold. By observing which one-shots are triggered, at any given time the amplitude of the correlator output signal could be deduced. This could be accomplished with digital logic and any further signal processing could also be digital in nature. This digital processing would require faster and/or more hardware.

Thus, while digital pulse stretching and its attendant digital circuitry may be utilized for post-correlator signal processing to permit further signal processing thereafter to be accomplished with slower speed hardware, this type of digital intermediate sampler itself may require very fast and/or complex hardware which must be traded off against the speed and complexity reduction in the hardware thereafter. That is, while the sampler does enable slower responding hardware to be used thereafter, some of the savings are offset or negated by the additional speed requirements and/or complexity in the sampler itself.

There is thus a need for a post-correlator sampler which enables slower speed processing hardware thereafter and which is itself simple and efficient.

SUMMARY

The present invention provides a subinterval sampler for detecting and processing short duration pulses with slower speed processing hardware than would otherwise be required. The sampler employs analog detection and is particularly efficient and easy to implement.

In one desirable aspect, the invention detects short duration analog input signal pulses over sampling intervals which do not have to be reduced to less than the duration of the signal pulses. The peak value of the analog input signal is detected during each sampling interval regardless of the absolute times at which peaks occur.

The invention ensures that no pulse spike is missed because the analog input signals are detected with a pair of peak detectors having active intervals which are overlapped and having nonconcurrent inactive intervals for clearing. An intermediate output is alternately switched between the peak detectors to provide a continuously active output having no inactive clearing interval. This output is sampled at the end of each sampling interval and held for the duration of the next interval.

The sampler is extremely tolerant of hardware shortcomings, and may be easily implemented without concern for most component delays, rise and fall times, and timing jitter. The sampler gives equal performance for all possible times that a maximum input signal level might occur.

DETAILED DESCRIPTION

Figure 1:
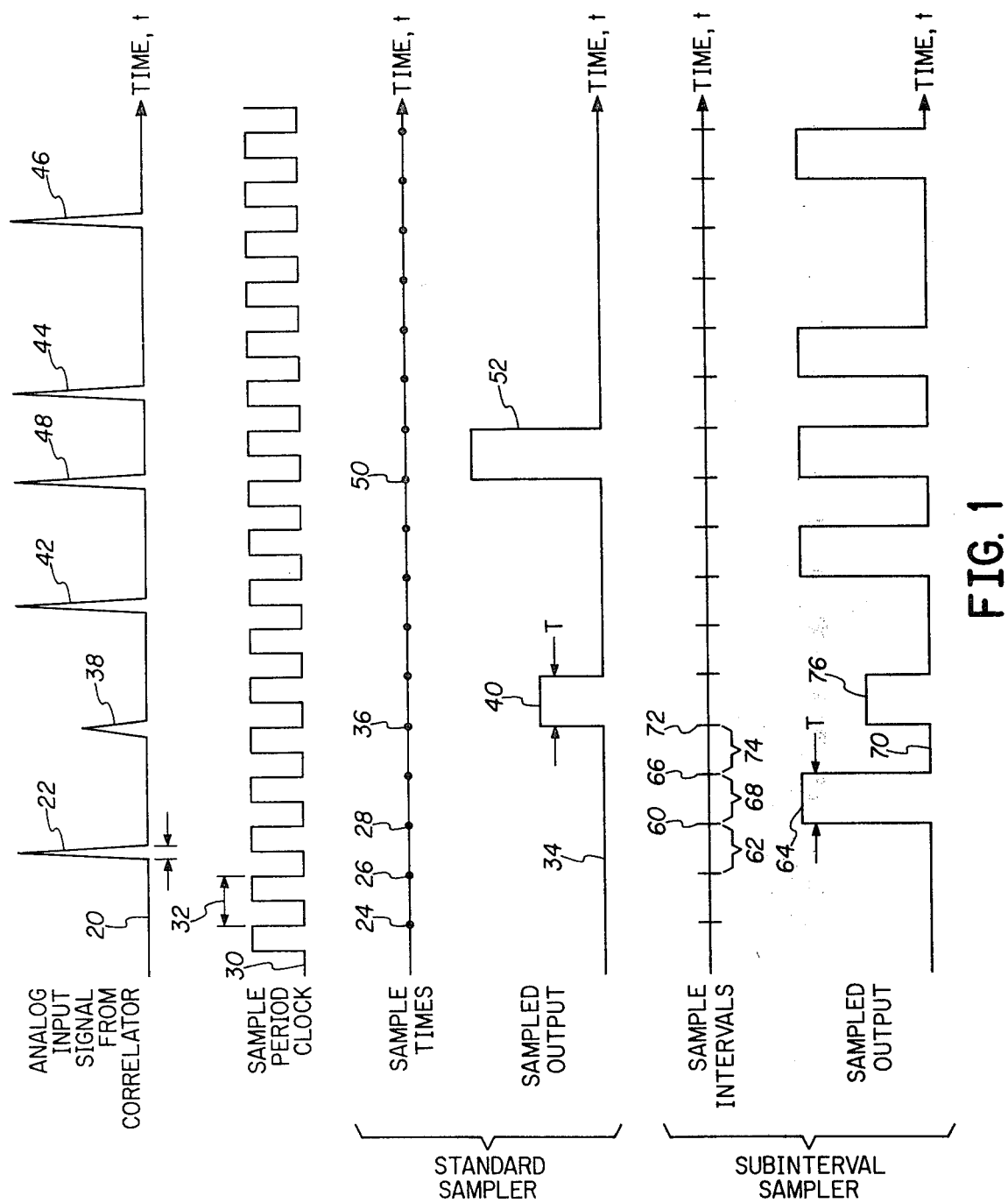
FIG. 1 is a timing diagram illustrating the operation of a standard sampler compared against the operation of a sampler constructed in accordance with the invention.

Referring to FIG. 1, there is shown an analog input signal 20 exemplary of that obtained from the output of a receiver correlator in a DSSS radio system. As in the above example, if the data bit rate is 100 kilobits per second and each data bit is spread into 1,000 chips at a 100 megabit per second rate, then the duration of correlation peak 22 is approximately 10 nanoseconds. A standard sampler at the output of the correlator samples analog signal 20 at sample times 24, 26, 28, etc. in accordance with a sample clock 30 having a given sampling period 32. In the particular example in FIG. 1, the sample times occur at the falling edge of sample clock 30.

Voltage spike 22 occurs between sample points 26 and 28 and thus there is no pulse indication at the sampler output 34. At sample time 36, a voltage spike 38 is occurring and this causes a pulse indication 40 at the sampler output. Pulse indication 40 has a duration of one sampling interval T, which is the period 32 of sample clock 30. The voltage spikes 42, 44, and 46 do not occur at sample times and thus are not detected at the sampler output 34. Voltage spike 48 occurs at sample time 50 and is thus detected at the sampler output 34 as shown by pulse indication 52.

The subinterval sampler of the present invention effectively samples analog signal 20 over an entire sampling interval T, and retains the largest value of the analog input signal which occurs within the sample interval T. As seen in FIG. 1, the subinterval sampler samples the analog input signal at sample time 60 and retains the largest value of signal 20 which has occurred within the immediately preceding sampling interval 62, which interval is terminated by sampling time 60. The subinterval sampler then outputs pulse indication 64 because voltage spike 22 occurred during interval 62. Pulse indication 64 has a duration of one sampling interval T. At the next sample time 66, the largest value of input signal 20 occurring during sampling interval 68 is zero and thus a zero level 70 is output by the sampler. At the next sampling time 72, voltage spike 38 has occurred during sampling interval 74 and thus the sampler outputs pulse indication 76.

As seen in FIG. 1, each of the voltage spikes in analog input signal 20 produces a pulse indication at the subinterval sampler output, regardless of the absolute times at which peaks occur. The subinterval sampler output may then be processed with much slower speed hardware than would otherwise be required to directly process signal 20 without the sampler interposed.

Figure 2:
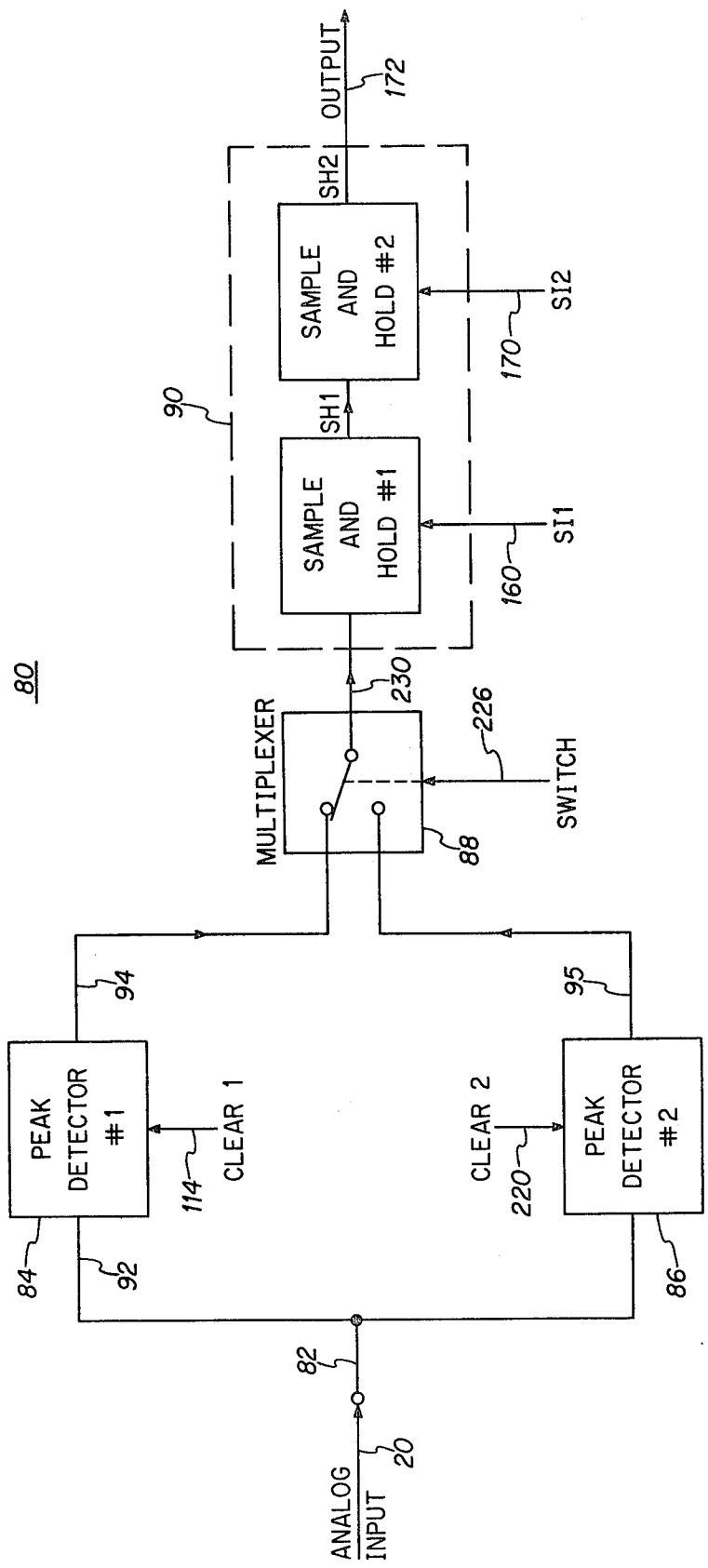
FIG. 2 is a schematic circuit block diagram of a subinterval sampler constructed in accordance with the invention.

FIG. 2 shows in block diagram the combination of components forming a subinterval sampler 80 constructed in accordance with the invention. Analog signal 20 from the correlator is delivered to an analog input connection 82 from which a pair of peak detectors 84 and 86 are connected in parallel. The outputs of these peak detectors are connected to electronic switch means 88, such as a 1 of 2 multiplexer/selector. The output of switch 88 is connected to sample and hold circuitry 90. Understanding the operation of subinterval sampler 80 will be facilitated by first understanding the operation of peak detectors 84 and 86, and then understanding the operation of the sample and hold circuitry 90.

Figure 3:
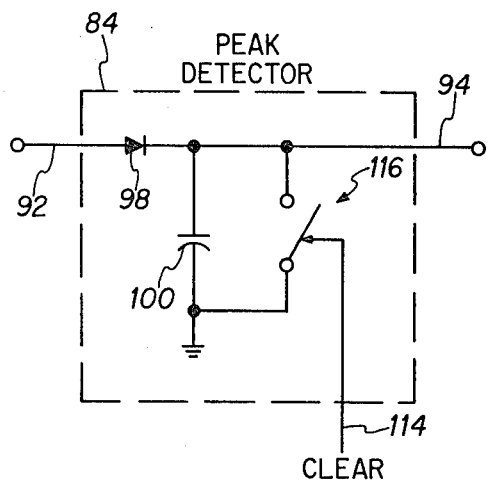
FIG. 3 is a schematic circuit diagram of one of the peak detectors in FIG. 2.

FIG. 3 schematically illustrates peak detector 84. Peak detector 86 is identical. Peak detector 84 has an input 92 connected to input 82, and an output 94 connected to one of the inputs to the switch 88, FIG. 2. An input signal 96, FIG. 4, applied at input 92 forward biases diode 98 and charges energy storage means, provided by capacitor 100, to the same level as input signal 96. This same level is also impressed on output 94, as shown by output signal 102, FIG. 4. This continues as long as the input signal 96 continues to increase.

When input signal 96 begins to decrease, the semiconductor breakover junction of diode 98 becomes reverse biased because of charged capacitor 100, and the capacitor cannot discharge through the reverse biased diode. It is thus seen in FIG. 4 that as the input signal 96 decreases at 104, the output signal 102 on output 94 does not decrease but rather retain its previous peaked value as shown as 106. If the input signal again begins to increase and rises above the level of its previous peak, as shown at 108, the input signal will exceed the charge on capacitor 100 and diode 98 is again forward biased. Capacitor 100 is then charged to a higher level equal to the new peak value 110 of the input signal. The output likewise rises to a new peak 112 corresponding to peak 110.

Figure 4:
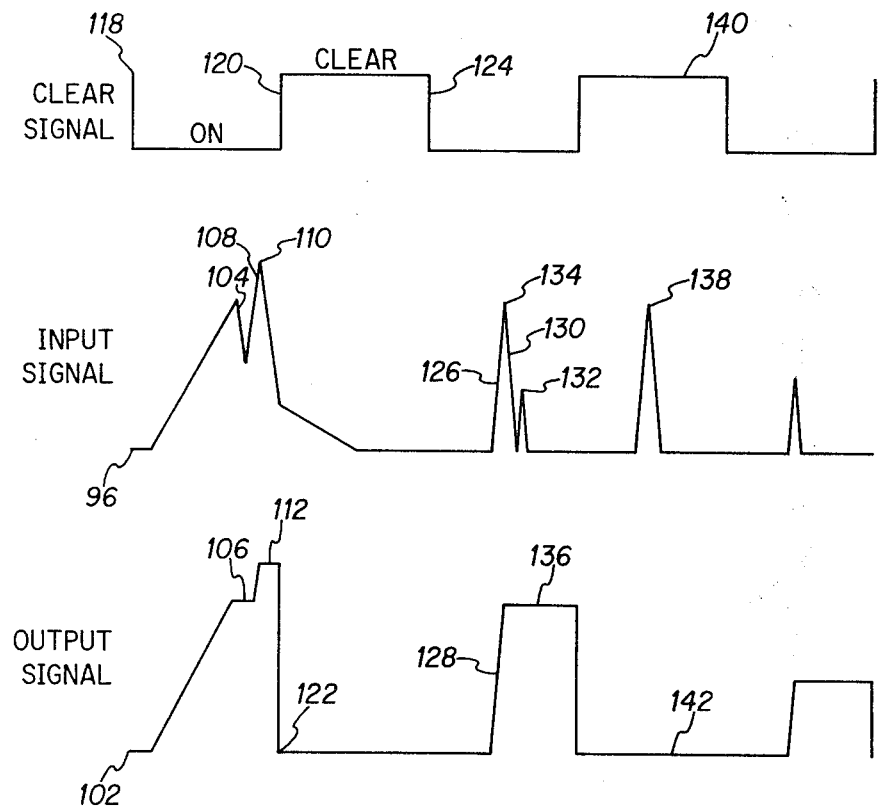
FIG. 4 is a timing diagram illustrating operation of the peak detector of FIG. 3.

A clearing signal applied on line 114, FIG. 3, closes electronic switch 116 such that capacitor 100 is shunted to ground and discharges. FIG. 4 shows this clear signal 118. The positive going edge 120 of this signal initiates clearing of peak detector 84 by closing switch 116 to shunt and discharge capacitor 100 such that the output signal 102 on output 94 drops to zero as shown at 122.

The falling edge 124 of the clear signal opens switch 116 such that capacitor 100 may again begin holding a charge. Thus, as the input signal 96 again begins to rise at 126, peak detector 84 is in an ON state, since clear signal 118 is low, and hence output signal 102 also begins to rise as shown at 128. The output signal does not fall when the input signal begins to decrease at 130, but instead holds its previously attained level as shown at 136. The next peak 132 in the input signal does not rise higher than the previous peak 134 and thus the output signal remains at level 136 corresponding to peak 134.

The next peak 138 in the input signal occurs when the peak detector is inactive, i.e., in an OFF state because clear signal 118 is high as shown at 140. Capacitor 100 thus cannot hold a charge and the output signal 102 at output 94 remains at a zero level as shown at 142. The clearing signal returns the peak detector to a zero state and forces output 102 to zero and blanks any memory of past events. In the actual implementation of the peak detector, diode 98 does not have a zero ON resistance nor an infinite OFF resistance, so that there is some degradation from the ideal performance shown in FIG. 4.

Figure 5:
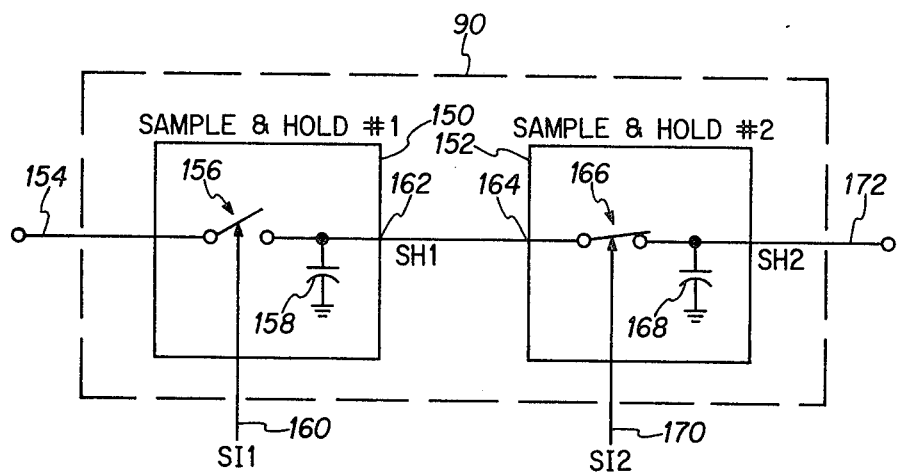
FIG. 5 is a schematic circuit diagram of the sample and hold circuitry of FIG. 2.
Figure 6:
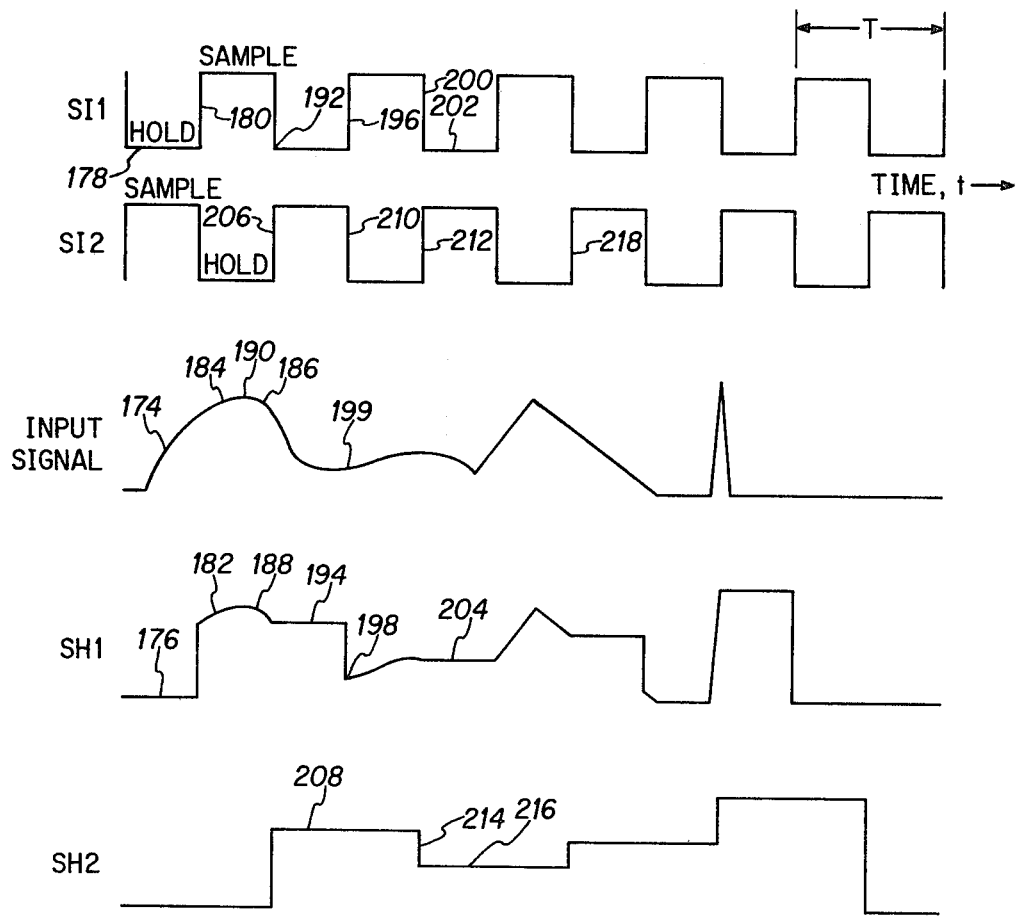
FIG. 6 is a timing diagram illustrating operation of the sample and hold circuitry of FIG. 5.

FIG. 5 schematically shows sample and hold circuitry 90 of FIG. 2, and FIG. 6 illustrates operation thereof independently of the input from peak detectors 84 and 86 and switch 88. Sample and hold circuitry 90 comprises a pair of cascaded sample and hold circuits 150 and 152. The first sample and hold circuit 150 has an input 154 connected to the output of switch 88. Circuit 150 includes an electronic switch 156 and a capacitor 158. A sampling interval (SI1) signal is applied on line 160. A high state of this sampling interval signal closes switch 156 such that the input signal on 154 is applied to capacitor 158 and the sample and hold output signal on output 162 tracks the input signal. When the sampling interval signal on line 160 is low, switch 156 is open and the input signal on 154 is not applied to capacitor 158, and the capacitor retains a charge equal to the value of the input signal just prior to the time that the sampling interval signal on 160 went low.

The second sample and hold circuit 152 has an input 164 connected to output 162. The second sample and hold circuit includes an electronic switch 166 and a capacitor 168. A second sampling interval signal (SI2) is applied on line 170 to close switch 166 and SI2 is high, and to open switch 166 when SI2 is low. SI2 is the inverse of SI1, as shown in FIG. 6. While one sample and hold circuit is tracking and sampling, the other is holding. The second sample and hold circuit 152 holds during the tracking time of the first sample and hold circuit 150 and tracks during the hold time of the first sample and hold circuit 150. The capacitance of capacitor 168 is chosen suitably smaller in value than that of capacitor 158, such that the charging of capacitor 168 when switch 166 is closed results in a negligible discharging of capacitor 158.

The combined effect of the two cascaded sample and hold circuits is sample and hold circuitry for which the output SH2 on line 172 only changes at discreet times. The input signal on 154 is sampled at a discreet instance in time and the output signal remains at the sampled value of the input signal through the duration of the sampling period T.

The two cascaded sample and hold circuits allow the utilization of square wave control clocks (SI1 and SI2). A single sample and hold circuit is of course within the scope of the invention and would preferably have a short sample time followed by a longer hold time.

Referring in more detail to FIG. 6, it is seen that as the input signal on 154 rises as at 174, the output SH1 on 162 from the first sample and hold circuit 150 remains at zero as shown at 176. This is because sampling interval signal SI1 is low as shown at 178. When signal SI1 goes high, as shown at transition 180, output signal SH1 begins to track the input signal as shown at signal portion 182 tracking rising input signal portion 184. As the input signal begins to decrease, as at 186, output signal SH1 tracks this decline and also starts to decrease as shown at 188. When sample and hold circuit 150 is connected to the output of switch 88 and peak detectors 84 and 86 in FIG. 2, the input signal on 154 would retain its peak value at 190 and not decrease as above described. FIG. 6 illustrates operation of the sample and hold circuitry independently of the peak detectors to facilitate understanding.

Output signal SH1 continues to track the input signal until signal SI1 transits low, as shown at 192, whereupon switch 156 opens, and sample and hold circuit 150 holds the value of charged capacitor 158 at the level attained just prior to the transition 192 in signal SI1. The level of output signal SH1 is thus maintained as shown at 194. At the next positive going transition 196 of sampling interval signal SI1, output SH1 again begins to track the input signal and immediately reverts to the value of the input signal at that particular time as shown at 198 corresponding to level 199 of the input signal. Output SH1 continues to track the input signal until the next low-going transition 200 of signal SI1. For the duration of the low state 202 of signal SI1, output SH1 remains at level 204. This cycle continues repeating with the output SH1 alternately tracking and holding.

The second sample and hold circuit 152 alternately tracks and holds the output of the first sample and hold circuit 150, but on staggered half cycles of the sampling interval T. When sampling interval signal SI2 transits high at 206, switch 166 closes and output 172 begins tracking input 164, the latter having output signal SH1 from the first sample and hold circuit. The output signal SH2 from the second sample and hold circuit on line 172 thus goes to level 208 which is comparable to level 194 of SH1. SH2 tracks SH1 until signal SI2 transits low at 210. During the half cycle interval between 206 and 210, signal SH1 remains constant at level 194 and hence signal SH2 also remains constant at its correspondent level 208. When sampling interval signal SI2 transits low at 210, switch 166 opens and charged capacitor 168 holds the value of output signal SH2 at level 208 until signal SI2 again transits high at 212, whereupon output signal SH2 again begins tracking signal SH1 as shown at transition 214 in SH2 to level 216 corresponding to level 204 in SH1. SH2 remains at level 216 for a full sampling interval T until signal SI2 again transits high at 218.

Figure 7:
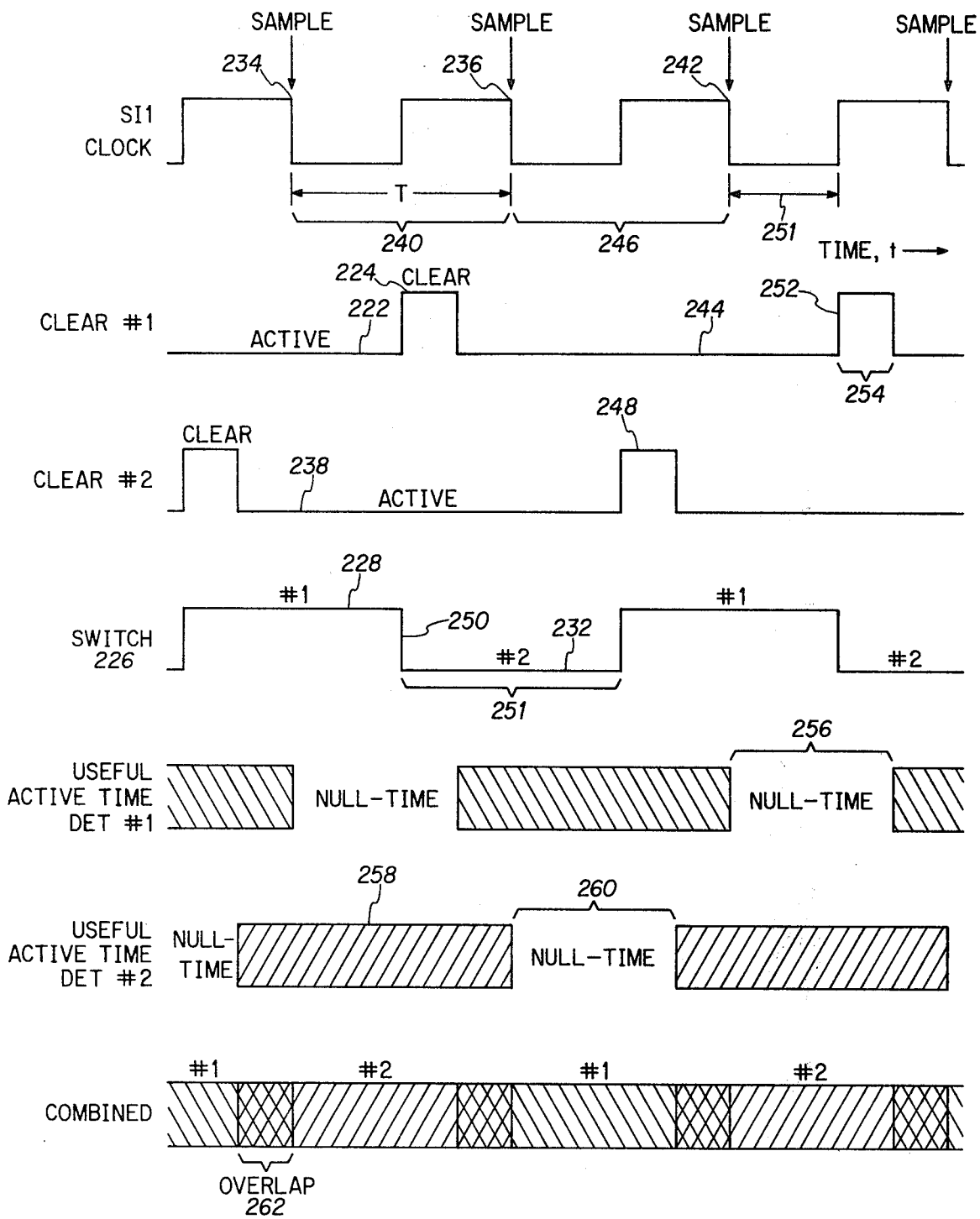
FIG. 7 is a timing diagram illustrating operation of the subinterval sampler of FIG. 2.

FIG. 7 is a timing diagram illustrating coordinated operation of the combination in FIG. 2. The first timing line illustrates the sampling interval clock providing the sampling interval signal SI1 on lead 160 in FIG. 5. Sampling interval signal SI2 is not shown, but is merely the inverse of SI1. The second timing line illustrates a CLEAR 1 signal applied on line 114 of FIGS. 2 and 3 to the first peak detector 84. The next timing line shows a CLEAR 2 signal applied on line 220 to the second peak detector 86, FIG. 2.

The CLEAR 1 signal has a low state as shown at 222 during which the first peak detector 84 is active. The CLEAR 1 signal has a high state as shown at 224 during which peak detector 84 is inactive. As previously described, when the CLEAR 1 signal is low, switch 116, FIG. 3, is open and peak detector 84 retains the highest value of the input signal which occurs during the active interval until the CLEAR 1 signal on 114 goes high to close switch 116. With the CLEAR 1 signal high at 224, peak detector 84 is returned to a zero state and during this inactive time it cannot detect or retain any input signal. The CLEAR 2 signal for the second peak detector 86 and its operation is comparable.

The fourth timing line in FIG. 7 shows a SWITCH signal 226 to multiplexer switch 88, FIG. 2. This SWITCH signal 226 has a high state 228 for choosing the first peak detector 84, as shown in FIG. 2, such that the contents from peak detector 84 is output on line 230. SWITCH signal 226 has a low state 232 for choosing the second peak detector 86.

As seen in the first timing line in FIG. 7, the output of the selected peak detector is sampled at the negative going transitions of Signal SI1. For example, at sampling time 234, SI1 goes low and SI2 goes high, FIGS. 5 and 6, such that output SH2 samples the level currently held on SH1. The level held on SH1 at the time of the negative transition 234, FIG. 7, of SI1 is equal to the current level at the input 154, FIG. 5. Therefore, the sample and hold circuitry 90 samples the signal at its input 154, FIG. 5, at the sampling times indicated on the first line of FIG. 7. The level on SH2 at sampling time 234 remains until the next sampling time 236, FIG. 7. At sampling time 236, SWITCH signal 226 is in its low state 232 such that the output of the second peak detector 86 is passed through the multiplexer switch 88 to the sample and hold circuitry. At sample time 236 then, the sample and hold circuitry reads the second peak detector 86. This second peak detector 86 has been active, as shown at 238 in the CLEAR 2 signal line, for the entire sampling interval 240 between sampling times 234 and 236.

At the next sampling time 242, SWITCH signal 226 is in its high state such that the first peak detector 84 is selected and read into the sample and hold circuitry. As shown at 244 in the CLEAR 1 signal line, the first peak detector 84 has been active during the entire sampling interval 246 between sampling times 236 and 242.

As seen in FIG. 7, one peak detector is active while the other is being cleared. The clear times, for example 224 and 248, are staggered such that the inactive intervals of the peak detectors are nonconcurrent. The output to the sample and hold circuitry is alternately switched between the peak detectors to provide a continuously active output having no inactive clearing interval. The output is sampled at the end of each sampling interval T. The multiplexer switch 88 is switched midway through the sampling interval T to assure that the input signal 230 to the sampling circuitry 90 is not in a transitory state at the sampling times 234, 236, 242, etc. As seen in FIG. 7, switching transition 250 in SWITCH signal 226 is between sampling times 234 and 236, and hence switching times such as 250 are nonconcurrent with sampling times such as 234 and 236. Sampling times occur at the end of and terminate sampling intervals T.

The fifth timing line in FIG. 7 shows the useful active time for the first peak detector 84. At the falling edge of the high portion 224 of the CLEAR 1 signal, the first peak detector becomes active as shown at 244. This actual active time 244 extends to the next positive transition 252 of the CLEAR 1 signal. Not all of this active time 244, however, is useful. At sampling time 242, the first peak detector 84 is chosen in accordance with SWITCH signal 226 and its contents are sampled. The first peak detector 84 remains active after sample time 242 until the CLEAR 1 signal rising edge 252, but during the interval 251 from point 242 to point 252, the SI1 signal is low and the first sample and hold circuit 150 cannot read or sample what is intput thereto from the first peak detector 84. Interval 251 is thus null-time which together with clear interval 254 constitutes null-time interval 256.

The second peak detector 86 has a useful active time interval 258, FIG. 7, which is less than the actual active time interval 238. Active interval 238 and useful active interval 258 start at the same instant, but the useful active time interval 258 terminates at sampling time 236 when SI1 goes low. This results in null-time 260 having a duration equal to the duration from sampling time 236 to the falling edge of clear pulse 248.

It is thus seen that a portion of the active time for the first peak detector 84 is not useful in the sense that any input signal peaks that charge the first peak detector 84 during this active but non-useful time will not be sampled from the first peak detector 84. These peaks will be sampled from the second peak detector 86.

As seen in the last three timing lines of FIG. 7, the null-time intervals for the first and second peak detectors are nonconcurrent. The useful active times, which exclude null-time, are shown for both peak detectors. The last line shows the combined useful active time which includes both peak detectors. The useful active time intervals for the first and second peak detectors 84 and 86 overlap such that no input signal peaks will ever be missed. Overlap 262 is longer than the rise time of the peak detectors.

A particularly desirable aspect of the invention is that the overlap 262 is easily made large enough such that considerable sloppiness in the implementation of subinterval sampler 80 can be tolerated with no noticeable degradation in performance. This makes implementation easy by eliminating concern for most component delays, rise and fall times, and timing jitter. Overlap 262 may be easily extended, and its particular further extent is not critical. This makes the sampler extremely tolerant of hardware shortcomings.

Figure 8:
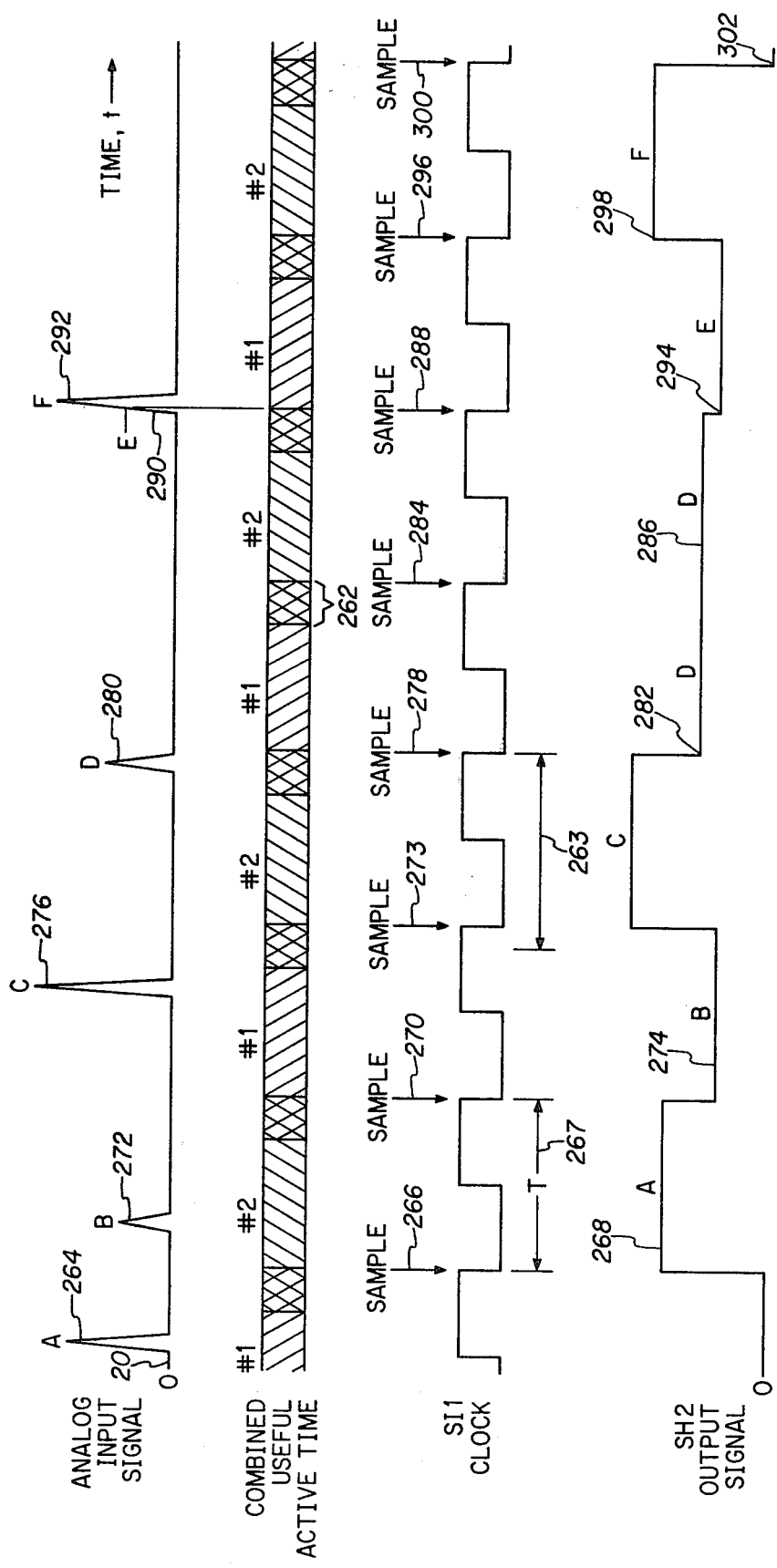
FIG. 8 is a timing diagram illustrating various examples of the operation of the subinterval sampler of FIG. 2 for various input spike arrival times.

FIG. 8 shows an arbitrary example of the operation of subinterval sampler 80. The first line shows an analog input signal with various peaks or voltage spikes. The second line shows the combined useful active time for the first and second peak detectors 84 and 86. The third line shows the SI1 sampling interval clock. The last line shows the output signal SH2 on lead 172 from the sample and hold circuitry 90.

Peak 264 occurs during the useful active time of the first peak detector 84 and is sampled at sample time 266 such that during the next sampling interval T, designated 267, the output signal segment 268 rises to a level A, which corresponds to the peak value A of spike 264. Output signal segment 268 remains at level A for the entire sampling interval 267 following sample time 266, until the next sampling time 270.

At sampling time 270, the second peak detector 86 is sampled and the largest voltage spike which has occurred during the active time of the second peak detector will be read out. As seen in FIG. 8, voltage spike 272 has occurred during the active time of the second peak detector and thus the output signal SH2 transits to a level B as shown at 274, which level reflects the peak value of spike 272.

At the next sampling time 273, the first peak detector 84 is sampled. Since spike 276 has occurred during the useful active time of the first peak detector, the output signal SH2 transits up to level C. At the next sampling time 278, the second peak detector 86 is sampled. During the useful active time of the second peak detector, voltage spike 280 has occured, and thus the second peak detector 86 has been charged to level D. The output signal SH2 thus transits to level D as shown at 282. At the next sampling time 284, the first peak detector 84 is sampled, and since spike 280 has occurred during the useful active time of the first peak detector, the output signal SH2 stays at level D as shown at 286.

At the next sample time 288, the second peak detector 86 is sampled. During the latter's useful active time, the highest level obtained by the analog input signal is level E because the sampling time 288 intercepts the rising portion 290 of a voltage spike 292 at level E. The output signal SH2 thus transitions to level E as shown at 294. At the next sample time 296, the first peak detector 84 is sampled, and during the useful active time of the first peak detector, voltage spike 292 finishes its rise and fall, peaking at level F. The output signal SH2 thus transitions to level F as shown at 298. At the next sample time 300, the second peak detector 86 is sampled, and during the useful active time of the latter, no input voltage spike occurs. The output signal SH2 thus transitions to the zero level as shown at 302.

Figure 9:
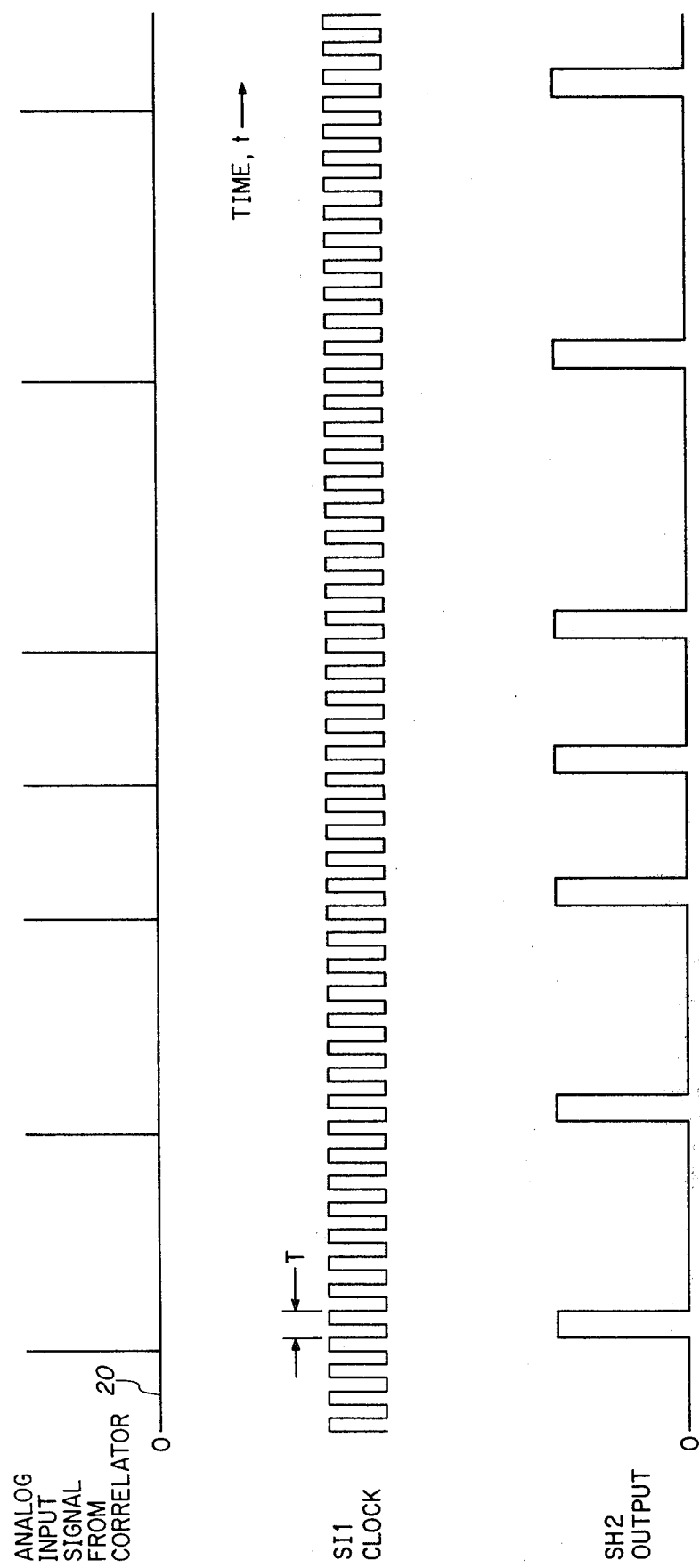
FIG. 9 is a timing diagram illustrating operation of the subinterval sampler of FIG. 2 for processing a sequence of narrow pulses from a receiver correlator in a DSSS radio system.

FIG. 9 illustrates a more realistic example of sampler operation, particularly the relative timing and duration of the analog input signal and the SI1 sampling interval. The first line shows the analog signal 20 input to the subinterval sampler from the correlator. The second line shows the SI1 sampling interval signal providing recursive sampling interval T. The third line shows the output signal SH2. The SI1 signal has a clock rate at least fractionally greater than the maximum rate at which the analog input signal spikes occur. This fraction is dependent upon the duration of the overlap region 262, FIGS. 7 and 8. Successive input pulses on analog input 82, FIG. 2, should be spaced by at least a minimum interval, 262, FIG. 8, equal to one sampling interval T plus one-half the length of overlap 262. The length of interval 263 is the minimum period for the input data signal 20 in the preferred embodiment and insures that all input spikes are sampled. For ease of implementation, a sampling rate of at least twice the maximum input signal spike rate is preferred.

In one implementation, the base data rate, i.e., the analog input signal 20, had an 11 microsecond period (11 $\mu$s. between signal spikes), and the SI1 signal had a 350 nanosecond period. In this implementation, the analog input signal 20 was derived from the output of a DSSS receiver correlator. The subinterval sampler 80 converts this sequence of narrow pulses into a sequence of wider pulses which can be more readily processed with much lower speed hardware than would otherwise be required, such as low speed charge coupled devices (CCD). Alternatively, the subsequent processing could be performed with digital logic, after analog to digital conversion. This type of signal processing is often required in a DSSS radio system in order to detect the presence of a particular information sequence which might indicate the start of data, the end of data, the type of encoding used for the data, the data rate, timing information necessary to receive the data, etc. The subinterval sampler generally allows the signal processing hardware thereafter to be slower by a factor of about 20 to 50, without noticeably affecting system performance.

The selection of components for use in the implementation of the subinterval sampler 80 is not critical. When the exception of the peak detectors, all components can operate at much slower speeds than would be needed for an ordinary sampler that was required to sample a sequence of very narrow spikes. The rise time of the peak detectors should be less than the duration of the correlation peaks .

As can be observed from FIG. 7, the exact time of occurrence and the rise and fall times of the peak detector clearing pulses such a 224 and 228 and of the SI1 signal are not critical. They should occur at a position in time relative to each other and transit rapidly enough such that overlap 262 is greater than the rise time of the peak detectors. The rise and fall times of the multiplexer SWITCH signal 226 and its timing relative to the SI1 signal is also not critical, since it is mainly necessary only to guarantee that the multiplexer switch 88 is not in a transitory state at the sampling times 234, 236, etc. SWITCH signal 226 is provided such that the first peak detector is selected for the sampling time that follows a clearing pulse to the second peak detector, and such that the second peak detector is selected for the sampling time that follows a clearing pulse to the first peak detector. It is preferred that the switching rate be equal to the sampling rate, i.e., the duration of switching interval 251, FIG. 7, be equal to the duration of sampling interval T. In other embodiments, the switching rate could be an odd multiple (3, 5, 7 . . . ) greater than the sampling rate, i.e., switching interval 251 is equal to or an odd multiple less than T.

Switching to the first peak detector and clearing the second peak detector occur during the same sampling interval T. Switching to the second peak detector and clearing the first peak detector occur during the immediately succeeding sampling interval. This cycle is repeated such that a given sampling time terminates a sampling interval over which one peak detector has been continuously active and such that the next sampling time terminates a sampling interval immediately succeeding this last mentioned sampling interval and over which the other peak detector has been continuously active. The peak detectors are concurrently active during a portion of each sampling interval. The sampling rate, determined by SI1, and the switching rate, determined by SWITCH signal 226, are equal but staggered in the preferred embodiment shown in FIG. 7 such that the switching times and sampling times are nonconcurrent, as shown by the offset between switching time 250 and sampling time 234. Further in the preferred embodiment, switching and clearing are concurrent, as shown by switching time 250 and clearing pulse 224.

Figure 10:
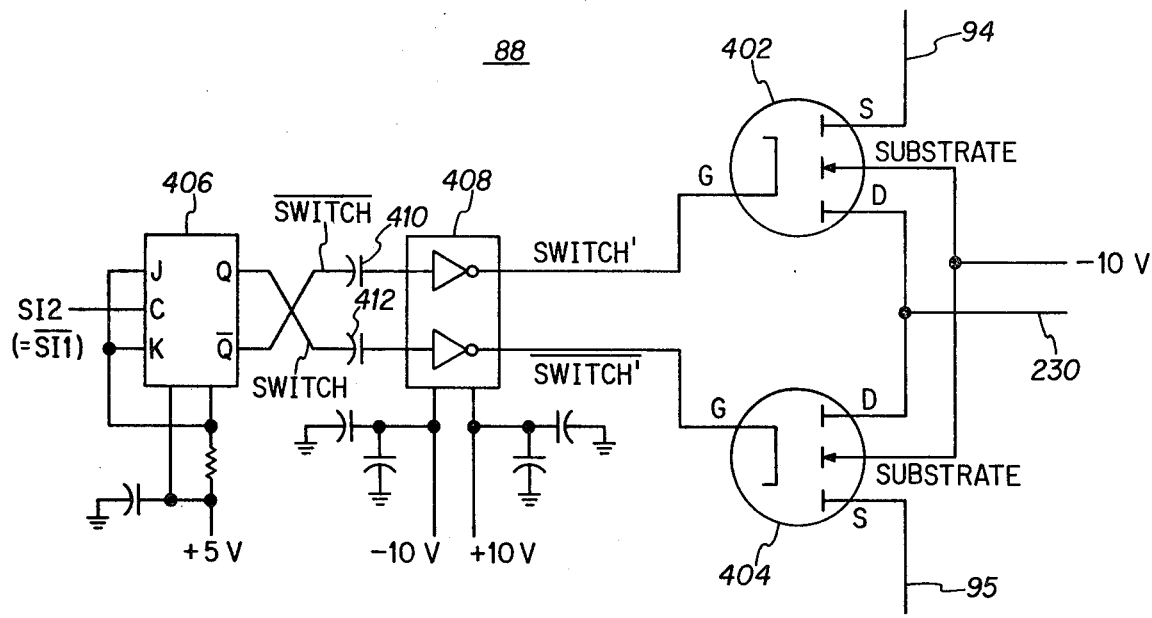
FIG. 10 is a circuit diagram showing an implementation of the multiplexer switch of FIG. 2.

FIG. 10 shows an implementation of multiplexer switch 88 of FIG. 2. In one implementation, switch 88 had a switching rate in the low megahertz range. The switching of output 230 between the two inputs 94 and 95 from peak detectors 84 and 86 is accomplished by two MOSFET devices 402 and 404 provided by an integrated circuit, such as a Signetics SD5000. The MOSFETs exhibit a low ON resistance of about 60 ohms or less between the drain (D) and the source (S) when a positive voltage of +5 volts or more exists between the gate (G) and the source. The MOSFETs exhibit a high OFF resistance (drain to source) in the megohm range when a zero or negative voltage exists between the gate and the source.

Switching of the MOSFETs is controlled by the gate to source voltage. The source voltage is a function of the analog voltage levels applied at inputs 94 and 95. The voltage level for the SWITCH signal applied to the gates of the MOSFETs is suitably chosen to guarantee that the MOSFETS are turned on and off for all values of analog signal levels occurring at inputs 94 and 95. In FIG. 10, the SWITCH signal transits from +10 to −10 volts. These levels accommodate an input signal range on 94 and 95 of at least +5 to −5 volts.

SWITCH and $\overline{SWITCH}$ signals which transit at the same time are generated by a J-K negative edge triggered flip-flop 406, such as a Texas Instruments SN54LS113AJ. The J and K inputs are both high and the outputs Q and $\overline{Q}$ toggle each time the input clock undergoes a negative transition. Sampling interval signal SI2 supplies this clock input.

An integrated circuit such as a Motorola MH0026U dual MOS clock driver converts the SWITCH and $\overline{SWITCH}$ signals to SWITCH' and $\overline{SWITCH}$' signals, respectively. The SWITCH and $\overline{SWITCH}$ signals range from +5 to 0 volts, and the SWITCH' and $\overline{SWITCH}$' signals range from +10 to −10 volts. The input signals to integrated circuit 408 are AC coupled by capacitors 410 and 412 because the lowest level of the input signals SWITCH and $\overline{SWITCH}$ is greater than the least positive supply voltage to integrated circuit 408, which is −10 volts. Thus, in order for integrated circuit 408 to translate a 0 volt input level to a −10 volt output level, capacitors 410 and 412 provide the requisite AC coupling. In one application, capacitors 410 and 412 each have a value of 680 picofarads which is approximately optimum for a sampling rate of 3 megahertz at the SI2 control signal terminal. The capacitors on the supply voltage lines to integrated circuit 408 serve to reduce the effects of current surges when circuit 408 switches from one state to another. The capacitor on the supply voltage lead to circuit 406 is comparable.

Figure 11:
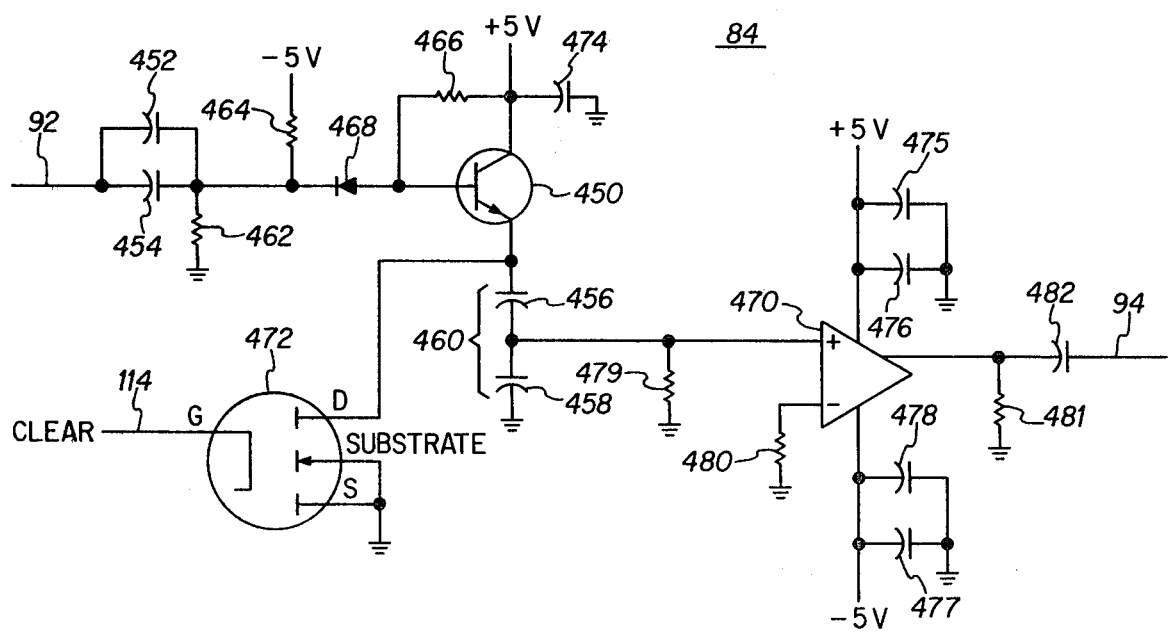
FIG. 11 is a more detailed circuit diagram of the peak detector of FIG. 3.

FIG. 11 shows an implementation of peak detector 84 of FIG. 3. A transistor 450, such as a 2N2857, is utilized to realize the diode function 98 of FIG. 3. A transistor provides current gain, and hence a faster rise time for the peak detector is achieved. Analog input signal 20 composed of short voltage spikes is applied on input 92 to capacitors 452 and 454. These capacitors isolate the slight DC bias applied to the base of transistor 450 from the source of the analog input signal applied at input 92. Capacitors 452 and 454 have different values and are used in parallel to provide a low AC impedance by such parallel combination over a wide range of analog input signal frequencies.

Transistor 450 has an emitter from which a pair of different valued capacitors 456 and 458 are connected in series. Capacitors 456 and 458 have a combined capacitance designated 460. For a positive voltage V1 applied at the base of transistor 450, capacitor combination 460 charges through the base-emitter junction of transistor 450 to a value V2 which is slightly less than V1. The slight difference is due to the junction voltage drop loss across the base-emitter junction of transistor 450.

If the input signal level from 92 decreases, capacitor combination 460 retains the voltage V2 because the base-emitter junction becomes reverse-biased and ceases to conduct. Thus, transistor 450 and capacitor combination 460 form a peak detector. Furthermore, since transistor 450 acts as a current amplifier, a collector-emitter current considerably greater than the base-emitter current is generated when the base-emitter junction is forward biased, such that the combined current charges the capacitor combination 460 at a much faster rate than could be obtained by the base-emitter current alone. This provides fast rise time for the peak detector.

The resistance of the base-emitter junction is a function of the voltage applied between the base and the emitter. If the base-emitter voltage is zero, the resistance is large. At a base-emitter voltage of about 0.6 volts, the base-emitter resistance begins to decrease and decreases rapidly as the base-emitter voltage is increased above the approximate threshold of about 0.6 volts. Capacitor combination 460 is thus never charged to a voltage exactly equal to the voltage applied to the base of transistor 450. The combination of resistors 462, 464 and 466, and diode 468, such as an 1N5711, tends to apply a slightly positive bias voltage to the base of transistor 450 such that in the absence of an input signal the base-emitter voltage is positioned closer to the base-emitter threshold voltage of about 0.6 volts. As the input signal at 92 increases it adds to the slight DC bias applied at the base of transistor 450 and causes capacitor combination 460 to charge. If the input signal from 92 peaks at a certain value, the voltage on the base of transistor 450 should be this peak input value plus the slight DC bias voltage. The additional slight DC bias approximately compensates the base-emitter junction drop loss, and hence the capacitor combination 460 charges to a value approximately equal to the peak input signal value, at which time the base-emitter junction of transistor 450 substantially ceases to conduct.

Diode 468 is biased in a forward direction via the path through resistor 466, diode 468, and resistor 462 and also resistor 464. This DC biasing enables the AC signal from input 92 to propagate through reversely poled diode 468 to the base of transistor 450. Diode 468 also affords temperature compensation. Changes in the base-emitter junction characteristic of transistor 450 as a function of temperature are compensated by a change in the opposite direction for the junction characteristic across diode 468 since diode 468 is installed such that the voltage drop thereacross is opposite the polarity of the voltage across the base-emitter junction of transistor 450.

A buffer amplifier 470 is provided to enable the peak detector formed by transistor 450 and capacitor combination 460 to drive a low impedance load without discharging the peak detector. Buffer amplifier 470, such as a Texas Instruments UA733ML, has a high input impedance and the ability to drive lower impedance loads. In one application, the capacitance values of capacitors 456 and 458 are selected such that these capacitors form a voltage divider and the voltage stored on capacitor 458 is approximately one-tenth of that stored on the series combination 460. This voltage divider thus acts as a voltage attenuator. The attenuation is provided to counteract the gain occurring in buffer amplifier 470, such as the noted Texas Instruments UA733ML providing a gain of ten. The voltage divider formed by capacitors 456 and 458 reduces the signal level input to amplifier 470 such that the gain of amplifier 470 does not result in saturation at output 94. The output at 94 may saturate at an AC peak-to-peak level of a few volts depending on load and frequency. In one use of example, it is desired to detect peaks as large as two volts at the input to the subinterval sampler, and attenuation is provided after the transistor peak detector 450 to avoide saturating the output of amplifier 470. Because of the internal capacitance to ground on the input to amplifier 470, a resistive voltage divider is not used since it would create an RC filter at the input to amplifier 470.

A MOSFET 472, such as a Signetics SD5000, acts as a switch which can shunt the charge on capacitor combination 460 to ground when MOSFET 472 is turned ON. This clears the peak detector. MOSFET 472 is turned ON when +5 volts is applied to its gate, and is OFF when zero volts is applied, for example as shown at 224 and 244, respectively, in FIG. 7. Peak detector 84 is thus cleared when a clear pulse 224 is applied at the clear terminal 114, FIGS. 3 and 11. Capacitors 474-478 serve to absorb the effects of current surges generated by transistor 450 and amplifier 470 and help maintain the stability of amplifier 470. Resistors 479-481 provide DC paths to ground. Capacitor 482 serves to AC couple the output of amplifier 470, since amplifier 470 normally operates with a DC bias of approximately 2 volts on its output.

The peak detector implementation of FIG. 11 provides a fast rise time of considerably less than 10 nanoseconds, is easily cleared, and readily drives a resistive load with an impedance of 1 kilohm or more.

Sample and hold circuitry 90, FIGS. 2 and 5, is provided in one implementation by a Reticon Tad-32A charge coupled device which functions as a tapped analog delay line and contains two cascaded sample and hold circuits at its input. After sampling the input signal, the sampled signal values are shifted cell-by-cell down the discreet time delay line. The rate at which the sampled signal is shifted down the delay line (cell-by-cell) is also equal to the sampling rate. A sequence of sampled pulses can be shifted down the delay line, and by appropriately summing the tapped cells of the delay line, particular pulse sequences can be detected.

It is recognized that various modifications are possible within the scope of the appended claims.

I claim:

1. A subinterval sampler for sampling short duration pulses with slower speed processing hardware than would otherwise be required, comprising:
   a pair of pulse detectors connected in parallel from an input, each detector having an active interval for pulse detection and an inactive interval for clearing said detector, the active intervals having an overlap period and the inactive intervals being nonconcurrent;
   switch means alternately outputting one and then the other of said detectors; and
   sample and hold means receiving the output of said switch means.

2. The invention according to claim 1 wherein:
   each said detector comprises a peak detector which retains the largest value of the input signal which occurs during said active interval;
   said sample and hold means has a sampling interval T; and
   said switch means has a switching interval T, but switching times nonconcurrent with the sampling times of said sample and hold means, such that said sample and hold means is sampled when said switch means is in a nontransitory state.

3. The invention according to claim 2 wherein said switch means selects one detector for the sampling time that follows clearing of the other detector.

4. The invention according to claim 3 wherein clearing of said detectors is concurrent with said switching times of said switch means, one detector being cleared when said switch means switches to the other detector, and said other detector being cleared when said switch means switches to said one detector.

5. The invention according to claim 1 wherein:
   each said detector comprises a peak detector which retains the largest value of the input signal which occurs during said active intervals; and
   said switch means selects one detector for the sampling time that follows clearing of the other detector, and selects said other detector for the sampling time that follows clearing of said one detector, such that the selected detector at a given sampling time has been continuously active for the entire sampling interval terminated by said sampling time, and such that the selected said other detector at the next successive sampling time has been continuously active for the entire sampling interval terminated by said last mentioned sampling time, such that said sampler selects the peak value of the input signal during each sampling interval regardless of the absolute times at which peaks occur.

6. The invention according to claim 5 wherein said sample and hold means comprises a pair of sample and hold circuits connected in series, the first sample and hold circuit sampling and tracking the output of said switch means while the second sample and hold circuit holds, the first sample and hold circuit holding while the second sample and hold circuit samples and tracks the output of the first sample and hold circuit, such that the output of said sample and hold means at the output of said second sample and hold circuit occurs at discreet intervals and has a duration of one sampling interval.

7. The invention according to claim 6 wherein each of said sample and hold circuits has a sampling interval T, and said switch means has a switching interval $\leq T$ such that said switch means alternately outputs each of said detectors for any two adjacent sampling times.

8. The invention according to claim 7 wherein said switching times are nonconcurrent with the sampling times of said sample and hold circuits such that said sample and hold circuits are sampled when said switch means is in a non-transitory state.

9. A subinterval sampler for sampling short duration analog input signal pulses with slower speed processing hardware than would otherwise be required, and for detecting the peak value of the analog input signal during every sampling interval regardless of the absolute times at which peaks occur, comprising:
a pair of peak detectors connected in parallel from an analog signal input, said peak detectors having active intervals overlapped by a duration longer than the rise time of said peak detectors, and having nonconcurrent inactive intervals for clearing;
switch means alternately switching between the outputs of said peak detectors to provide continuously active detection with no inactive clearing interval; and
sample and hold means at the output of said switch means for sampling the selected peak detector at the end of each sampling interval.

10. The invention according to claim 9 wherein:
said peak detectors are concurrently active during a portion of each sampling interval;
the switching rate is equal to or an odd multiple greater than the sampling rate, and staggered such that the switching times and sampling times are nonconcurrent; and
the sampling rate is at least fractionally greater than the maximum analog input signal rate such that successive input pulses are spaced by at least a minimum interval equal to one sampling interval plus one-half the length of said overlap.

11. The invention according to claim 9 wherein each said peak detector comprises a semiconductor breakover junction and energy storage means for receiving and holding increasing signal levels through said junction, said junction becoming reversed biased in response to decreasing signal levels such that said energy storage means does not discharge therethrough.

12. The invention according to claim 9 wherein each said peak detector comprises a junction transistor having a base driven by said analog input signal, and capacitor means charged through one of the base junctions of said transistor in response to increasing levels of said analog input signal, decreasing levels of said analog input signal reducing the potential level of said base relative to said capacitor means such that said junction becomes reverse biased and prevents discharge of said capacitor means therethrough, said transistor further charging said capacitor means with amplified current through the other base junction to substantially reduce charging time of said capacitor means whereby to provide a fast rise time peak detector.

13. The invention according to claim 12 wherein said capacitor means comprises a pair of capacitors forming a voltage divider to provide voltage attenuation, and further comprising a buffer amplifier having an input connected to a point between said capacitors for receiving said attenuated voltage, said buffer amplifier enabling said peak detector to drive a low impedance load without discharging said peak detector.

14. The invention according to claim 12 comprising a diode in series in the base lead from said analog input signal to said base of said transistor and oppositely poled with respect to said one base junction for providing a slight bias corresponding to the threshold voltage of said one base junction to enable said capacitor means to be charged to substantially the level of said input signal.

15. The invention according to claim 14 comprising a pair of different valued parallel capacitors connected in said base lead to provide low AC impedance over a wide range of analog input signal frequencies.

16. The invention according to claim 12 comprising a FET connected to said capacitor means for discharging the latter through said FET in response to a clear signal applied to the gate of said FET during a clearing interval when said switch means has switched to the other peak detector.

17. The invention according to claim 9 wherein said switch means comprises:
a first semiconductor switch having an input from one peak detector and an output to said sample and hold means;
a second semiconductor switch having an input from the other peak detector and an output to said sample and hold means in common with said output of said first semiconductor switch; and
means for supplying gating signals to said first and second semiconductor switches and for changing the states of said gating signals at said switching rate.

18. The invention according to claim 9 wherein said switch means comprises:
a pair of FETs having a common output to said sample and hold means, each FET having an input from a respective one of said peak detectors; and
a flip-flop having Q and $\overline{Q}$ outputs each connected to a gate of a respective one of said FETs and toggled at said switching rate.

19. The invention according to claim 18 further comprising signal level translation means between said flip-flop and said FETs.

20. A method of sampling short duration analog input signal pulses with slower speed processing hardware than would otherwise be required, comprising:
establishing a recursive sampling interval T for sampling said analog input signal;

detecting the peak value of said analog input signal during each sampling interval regardless of the absolute times at which peaks occur, comprising:

detecting said analog input signal with a pair of peak detectors having active intervals which are overlapped, and having non-concurrent inactive intervals for clearing;

switching between said peak detectors to provide continuously active detection with no inactive clearing interval; and sampling the switched output of said peak detectors at the end of each sampling interval.

21. The invention according to claim 20 wherein said active intervals are overlapped by a duration longer than the rise time of said peak detectors 22. The invention according to claim 21 comprising switching between said peak detectors at switching times nonconcurrent with sampling times, the latter occurring at the end of said sampling intervals.

23. The invention according to claim 20 comprising switching to one peak detector and clearing the other peak detector during the same sampling interval, and switching to said other peak detector and clearing said one peak detector during the immediately succeeding sampling interval, and repeating the cycle such that a given sampling time terminates a sampling interval over which one peak detector has been continuously active and such that the next sampling time terminates a sampling interval immediately succeeding said last mentioned sampling interval and over which the other peak detector has been continuously active.

24. The invention according to claim 23 wherein said peak detectors are concurrently active during a portion of each sampling interval.

25. The invention according to claim 24 wherein the sampling interval is equal to or an odd multiple less than the switching interval, and staggered such that the switching times and sampling times are non-concurrent.

26. The invention according to claim 25 wherein said switching and clearing are concurrent.

27. The invention according to claim 25 comprising:

establishing said sampling times at a rate at least fractionally greater than the maximum input signal rate dependent upon the length of said overlap, such that successive input pulses are spaced by at least a minimum interval equal to one sampling interval T plus one-half the length of said overlap.

* * * * *